(12) United States Patent
Lupu et al.

(10) Patent No.: US 10,658,816 B2
(45) Date of Patent: May 19, 2020

(54) DISTRIBUTED FEEDBACK LASER DIODE

(71) Applicants: UNIVERSITE PARIS SUD, Orsay (FR); CENTRE NATIONAL DE LA RECHERCHE SCIENTIFIQUE, Paris (FR)

(72) Inventors: Anatole Lupu, Fontainebleau (FR); Natalia Dubrovina, Palaiseau (FR); Abderrahim Ramdane, Sceaux (FR); Henri Benisty, Palaiseau (FR)

(73) Assignees: UNIVERSITE PARIS SUD, Orsay (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 0 days.

(21) Appl. No.: 16/320,758

(22) PCT Filed: Jul. 27, 2017

(86) PCT No.: PCT/EP2017/069069
§ 371 (c)(1),
(2) Date: Jan. 25, 2019

(87) PCT Pub. No.: WO2018/019955
PCT Pub. Date: Feb. 1, 2018

(65) Prior Publication Data
US 2019/0165545 A1 May 30, 2019

(30) Foreign Application Priority Data
Jul. 27, 2016 (FR) .................................. 16 57217

(51) Int. Cl.
*H01S 5/12* (2006.01)
*H01S 5/065* (2006.01)
*H01S 5/22* (2006.01)

(52) U.S. Cl.
CPC .......... *H01S 5/1237* (2013.01); *H01S 5/0654* (2013.01); *H01S 5/12* (2013.01); *H01S 5/22* (2013.01)

(58) Field of Classification Search
CPC ............. H01S 5/12–125; H01S 5/0654; H01S 5/22–2228; H01S 5/2018–2031; H01S 2301/16–163
See application file for complete search history.

(56) References Cited

U.S. PATENT DOCUMENTS 7,796,656 B2 9/2010 Watson et al.
2003/0076865 A1* 4/2003 Chang-Hasnain ..... B82Y 20/00
372/46.01

(Continued)

FOREIGN PATENT DOCUMENTS

WO WO 2005/011076 2/2005

OTHER PUBLICATIONS

International Search Report issued in International Patent Application No. PCT/EP2017/069069, dated Nov. 24, 2011.

(Continued)

*Primary Examiner* — Joshua King
(74) *Attorney, Agent, or Firm* — Norton Rose Fulbright US LLP

(57) ABSTRACT

The invention relates to a distributed feedback laser diode (10) comprising a waveguide with a gain medium assisted by a network formed by a distribution of elements (22) including a sub-set comprising localised resonators (24) distributed along the axis of the waveguide, characterised in that the frequency characteristic of the feedback induced on the wave of the guide by the spatial distribution of said elements differs by less than 50% of the resonance frequency of said localised resonators.

17 Claims, 1 Drawing Sheet

(56) References Cited

U.S. PATENT DOCUMENTS

Figure 1:
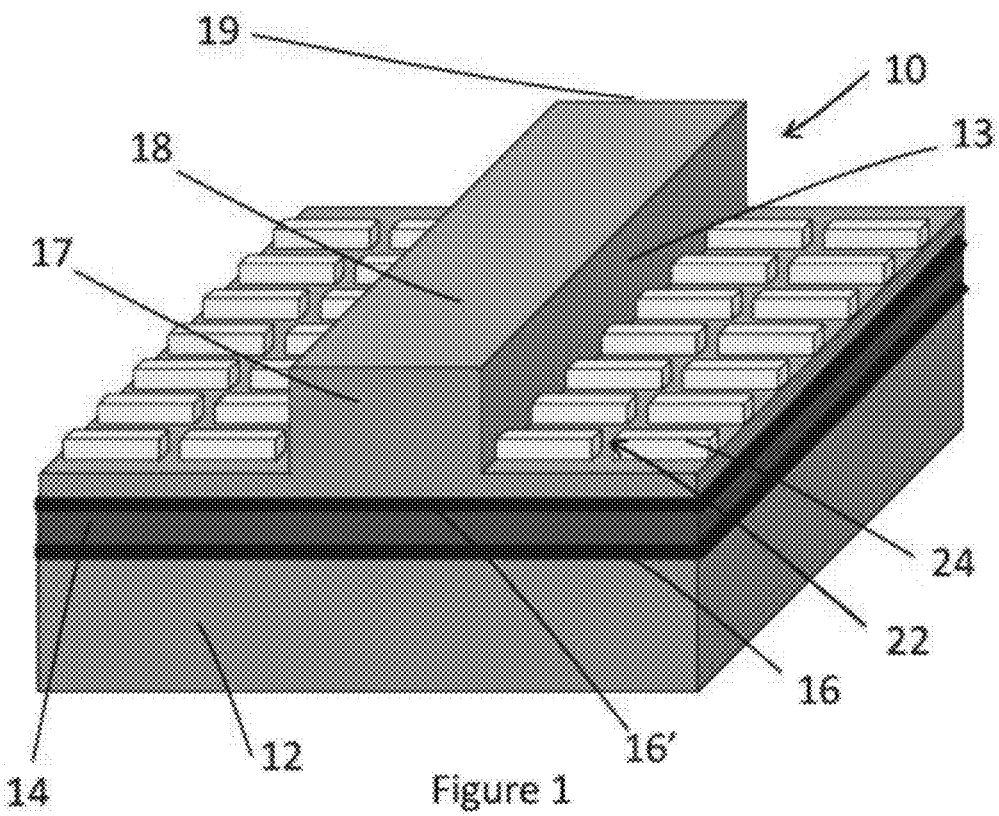

| | | | | |
|---|---|---|---|---|
| 2005/0167648 A1* | 8/2005 | Chang-Hasnain | ...... | H01S 5/026 257/14 |
| 2007/0009205 A1* | 1/2007 | Maleki | ................. | G02B 6/122 385/27 |
| 2007/0133648 A1* | 6/2007 | Matsuda | ................ | B82Y 20/00 372/102 |
| 2010/0322557 A1* | 12/2010 | Matsuda | ................ | B82Y 20/00 385/37 |

OTHER PUBLICATIONS

Wiedmann et al., "GaInAsP/InP Distributed Reflector Lasers Consisting of Deeply Etched Vertical Gratings" *Japanese Journal of Applied Physics*, 2001, 40(12):6845-6851.

\* cited by examiner

DISTRIBUTED FEEDBACK LASER DIODE

CROSS-REFERENCE TO RELATED APPLICATIONS

This application is a national phase application under 35 U.S.C. § 371 of International Application No. PCT/EP2017/069069 filed 27 Jul. 2017, which claims priority to French Patent Application No. 1657217 filed 27 Jul. 2016. The entire contents of each of the above-referenced disclosures is specifically incorporated by reference herein without disclaimer.

The invention relates to a distributed feedback laser diode as well as a telecommunication device comprising a laser diode according to the invention as an optical source.

Distributed feedback laser diodes are used as an optical source for optical fibre connections, particularly due to the spectral purity thereof. Spectral purity is a critical parameter for obtaining high bandwidths over long fibre distances.

The single-mode spectral operation of this type of laser is obtained by means of a periodic grating distributed along an active guide including a gain medium. The role of the grating is to ensure periodic modulation of the real or imaginary part of the effective index $n_{eff}$ of the guide and thus obtain the selective feedback condition on the Bragg condition ensuring single-frequency laser operation. The Bragg condition correlates the period $\Lambda$, the emission wavelength $\lambda$, quotient of the speed of light c by the optical frequency f, and the mean effective index $n_{eff}$ of the mode whereby $\Lambda = 2n_{eff}\lambda$ for so-called first-order feedback, or more rarely whereby $\Lambda = 2 m\, n_{eff}\lambda$ where m is an integer, for the so-called higher orders, less advantageous but possible choices. The parameter which governs the quantity of light channeled in the feedback is referred to as the coupling coefficient, it is generally given in $cm^{-1}$, coupling per unit of length. The value thereof and the exact parameters of the structure determine the exact value of the frequency of the laser—or of the two frequencies when single-frequency operation is not obtained, —which deviates slightly from said Bragg condition.

One of the major problems encountered in the operation of these lasers is the sensitivity thereof to parasitic optical feedback in the optical transmission line. An optical feedback greater than a critical threshold results in the collapse of the coherence of these lasers, which is conveyed by an increase in the spectral width thereof, and a major penalty for optical communication quality and throughput. To remedy this problem, optical isolators are integrated in laser modules resulting in a very significant increase in the price of the module.

Research on solutions capable of resulting in operation free from optical isolators has been conducted for many years.

One of the solutions proposed, in particular by R. Hui, M. Kavehrad and T. Makino, in the article "External feedback sensitivity of partly gain coupled DFB semiconductor lasers," IEEE Photon. Technol. Lett. 6, 897-899, (1994), is that of using lasers with loss-modulation gratings. The emission of this type of laser proves to be robust with respect to the optical feedback. Chromium-based metal gratings make it possible to attain coupling coefficients of 5 to 20 $cm^{-1}$. Producing a significant increase in the Bragg grating strength beyond these values proves to be difficult in technical terms but above all it induces a negative impact on laser operation.

As the grating is highly absorbent, this is conveyed by an increase in the mean loss value and consequently an increase in the noise level, or RIN—relative intensity noise.

Finally, there have been attempts at partial coupling with the gain, by partially etching the active part of the guiding layer, for example when it is formed from multiple quantum wells by etching some quantum wells but not all, in particular G. P. Li, T. Makino, R. Moore and N. Puetz in the article "1.55 mu m index/gain coupled DFB lasers with strained layer multiquantum-well active grating," Electron. Lett. 28, 1726-1727 (1992). However, the electrical characteristics are generally too degraded by this operation for the component to obtain a usable benefit.

The aim of the present invention is that of proposing a laser diode not exhibiting the drawbacks of the prior art.

The invention thus relates to a distributed feedback laser diode comprising a waveguide with a gain medium assisted by a grating formed by a distribution of elements including a subset comprising localised resonators distributed along the axis of the waveguide, wherein the characteristic frequency of the feedback induced on the wave of the guide by the spatial distribution of said elements differs by less than 50% from the resonance frequency of said localised resonators.

Advantageously, the structure of the laser diode according to the invention makes it possible to obtain the induced transparency effect which greatly enhances the single-frequency output, output power and laser selectivity.

The laser diode according to the invention may also comprise one or a plurality of the features hereinafter, taken into consideration individually or according to all technically feasible combinations:

- the laser diode is configured such that the optical confinement factor of the wave of the guide with localised resonators is adjusted so as to enable an induced transparency phenomenon; and/or
- the elements are distributed in the form of a periodic grating along the main axis of the waveguide; and/or
- the characteristic frequency of the feedback induced by the grating formed by the distributed elements differs by less than 20% from the resonance frequency of the localised resonators themselves; and/or
- the localised resonators comprise at least one element having a dimension between ⅕ and 1/20 of the ratio between the speed of light c and the frequency f of the laser emission in a direction substantially perpendicular to the main axis of the waveguide; and/or
- the elements forming the resonant localised resonators are arranged such that the greatest dimension is oriented along the direction of one of the non-null electric fields of the guided wave; and/or
- the resonant elements the localised resonators are arranged such that the greatest dimension is oriented along the direction of the dominant electric field of the guided wave, for example a direction perpendicular to the axis of the waveguide; and/or
- the elements forming the resonant localised resonators are arranged such that the greatest dimension is oriented along a direction perpendicular to the axis of the waveguide; and/or
- the localised resonators are arranged along a direction substantially perpendicular to the main axis of the waveguide with a separation therebetween less than the dimension of the localised resonators along said direction, for example the separation is between 1/10 and 1/50 of c/f; and/or the distance between the localised resonators closest to the waveguide and the flank of the waveguide is less than or equal to 1/10 of c/f, preferably in contact with one of the edges of the guide; and/or the localised resonators are at least partially inside the waveguide; and/or each period of the periodic grating comprises between 1 and 10 localised resonators; and/or the localised resonators consist of a meta-material, for example of dielectric, metallic or metallo-dielectric nature; and/or the quality factor of the localised resonators is adjusted between 10 and 100 using a dissipative material at the laser emission frequency, such as a metal.

The invention also relates to a telecommunication device comprising a laser diode according to the invention as an optical source.

The telecommunication device according to the invention may not comprise an optical isolator.

Figure 2:
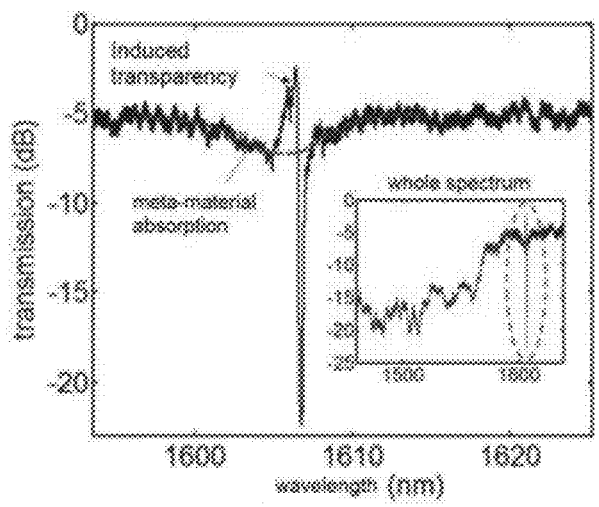

The present invention will be understood more clearly in the light of the following description which is merely given by way of indication and which is not intended to restrict said invention, accompanied by the following figures:

FIG. 1 is a schematic representation of a distributed feedback laser diode with a grating according to the invention, and FIG. 2 represents a transmission spectrum of a waveguide with a grating according to the invention showing the induced transparency effect.

It should be noted that these drawings have no other aim than to illustrate the text of the description and in no way constitute a restriction of the scope of the invention.

In the different figures, the different elements are not necessarily represented to scale so as to present a view enabling easier comprehension of the invention.

FIG. 1 illustrates schematically the structure of a laser diode 10 according to an embodiment of the invention.

As illustrated in FIG. 1, a laser diode 10 according to the invention may comprise:

a semiconductor substrate 12, a laterally guiding structure 13, an active layer 14 arranged on the semiconductor substrate 12, the active layer 14 is surrounded by thin layers 16 and 16' forming a so-called Separate Confinement Heterostructure zone "SCH"

a semiconductor layer 18 arranged on the thin layer 16', a waveguide formed by the combination of the layers 12,14,16,16' and 18 and a lateral limitation of the wave and the current by the laterally guiding structure 13. Such a structure 13 is obtained typically but not exclusively by etching removing the material around same, and a grating 20 arranged on either side of the waveguide.

Generally, the difference layers are arranged on a semiconductor substrate 12, for example by means of an epitaxy method.

The semiconductor substrate 12 material is defined by the laser diode wavelength range sought, according to epitaxy considerations well-known to those skilled in the art.

The active layer 14 may be prepared as a thin layer, for example of a thickness of approximately 0.2 µm. The composition thereof makes it possible to obtain under electrical injection an optical gain around the wavelength sought, of a typical spectral width $\Delta\lambda=\Delta(c/f)$ between 3 and 300 nm.

The active layer 14 arranged on the semiconductor substrate is the layer wherein at least one partial population inversion is possible. The photons which are created by spontaneous emission are emitted particularly in a longitudinal direction, and are amplified by stimulated emission because they are subject to distributed feedback, as well as a possible reflection on the mirrors at the ends of the laser.

For laser diodes having a lateral coupling, the net gain modulation, —i.e. the pure amplification due to the stimulated emission reduced by the internal absorption, —is conveyed by the selection of a single longitudinal natural mode of the laser cavity due to the frequency at which the combined reflection of the selective absorption minimum of the photons on the periodic surface structure occurs.

While the semiconductor substrate 12 is generally n-doped, the semiconductor layer 18 arranged on the active layer 16' is generally p-doped, so as to provide a pin junction forming a diode, and also a minimisation of ohmic resistances in view of technological constraints.

The thickness and doping quantity of the semiconductor layer 18 and of the semiconductor substrate 12 are generally of comparable orders of magnitude.

As illustrated in FIG. 1, when the epitaxy process is complete, the semiconductor layer 18 between the mirrors of the laser 17 and 19 is removed around the edge of the waveguide for example during an etching step. The remaining central part 13 of the semiconductor layer 18 forms the edge of the waveguide. The latter may be straight, as represented in the figure, or of any other shape enabling wave guiding.

As represented in FIG. 1, the laser diode according to the invention comprises a grating 20 arranged on either side of the edge of the waveguide.

The grating 20 is formed by a distribution of elements 22 distributed along the axis of the waveguide.

The confinement factor Γ of the grating is defined as the overlap ratio between the intensity profile of the optical mode propagated in the waveguide and the cross-section in a transverse plane of the elements of the periodic grating.

At least one subset of the elements 22 of the grating 20 comprises localised resonators 24.

The distribution of the elements 22 along the waveguide is such that the characteristic frequency of the feedback induced on the wave of the guide by this distribution differs by less than 50%, for example less than 40%, from the resonance frequency of said localised resonators 24.

According to an embodiment of the invention, the grating and the waveguide are configured such that the characteristic frequency of the feedback induced by the grating formed by the elements 22 differs by less than 30%, for example less than 20% from the resonance frequency of the localised resonators 22 themselves.

As represented in FIG. 1, the elements 22 are distributed in periodic grating form along the main axis of the waveguide.

In the embodiment represented in FIG. 1, each element 22 of the grating comprises two localised resonators. However, the invention is not restricted to this embodiment. In particular, only a subset f of the elements 22 of the network can comprise localised resonators, for example one element out of two or one out of three. Furthermore, the number of localised resonators 24 per element 22 may be greater than two, for example between 1 and 10, and this number may be different from one element to another.

The distance between the edges of the localised resonators closest to the waveguide and the flank of the waveguide is typically less than or equal to 1/10 of c/f, where c is the speed of light and f the laser emission frequency. Preferably, the localised resonators closest to the waveguide are in contact with the flank of the edge of the waveguide.

Though not represented in FIG. 1, at least some, for example all, of the localised resonators may be at least partially inside the waveguide. This has the advantage of reinforcing the interaction with the guided mode.

The localised resonators comprise at least one element having a dimension between ⅕ and ¹⁄₂₀ of the ratio between the speed of light c and the laser emission frequency f, in a direction substantially perpendicular to the main axis of the waveguide.

As illustrated in FIG. 1, the elements of the localised resonators may have a substantially parallelepipedal shape.

According to an embodiment, the elements forming the resonant localised resonators are arranged such that the greatest dimension is oriented along the direction of one of the non-null electric fields of the guided wave, in particular along the direction of the dominant electric field of the guided wave.

Furthermore, as illustrated in FIG. 1, the localised resonators are arranged along a direction substantially perpendicular to the main axis of the waveguide with a separation therebetween less than the dimension of the localised resonators along said direction, for example the separation is between ¹⁄₁₀ and ¹⁄₅₀ of c/f, where c is the speed of light and f the laser emission frequency.

The localised resonators may consist of a meta-material, for example of dielectric, metallic or metallo-dielectric nature. Advantageously, the resonant properties of the meta-material make it possible to increase by one order of magnitude the Bragg grating feedback strength.

Furthermore, according to an embodiment of the invention, the quality factor of the localised resonators is adjusted between 10 and 100 using a dissipative material at the laser emission frequency, such as a metal. In this case, the feedback frequency and the natural frequency of the resonators must be adjusted accordingly, so that one falls in the spectral width of the other.

According to a preferred embodiment, the grating and the waveguide are configured such that the optical confinement factor of the wave of the guide with localised resonators is adjusted so as to enable an induced transparency phenomenon.

The induced transparency phenomenon corresponds to the destructive interference effect between coupled resonant oscillators results in the appearance of a narrow window of transparency in the middle of an absorption band. This phenomenon represents a conventional analogy of the induced transparency effect observed in atomic physics.

In the case of plasmonic resonators, the destructive interference effect of localised surface plasmons due to the evanescent coupling between resonant plasmonic elements results in the appearance of a narrow window of transparency in the middle of an absorption band.

In particular, it is possible to act upon the proximity and/or index of the localised resonators.

The induced transparency mode has a large number of advantages.

Unlike the usual case of Bragg grating guides, the high density of photonic states promoting the action of the laser is also accompanied by a maximum in transmission.

The low quality factor of plasmonic nano-resonators renders the induced transparency particularly robust with respect to the wave front phase disturbances. It is particularly this property which is targeted to render the laser very tolerant with respect to parasitic feedback in optical communications at 1.5 μm.

The single-mode spectral operation of the laser according to the invention is the direct consequence of the high density of states associated with the induced transparency phenomenon.

The operation of the laser in induced transparency mode reduces losses associated with metal absorption substantially and consequently the level of gain as well as the injection current used to attain the laser emission threshold.

As illustrated in FIG. 2, the spectral window associated with the induced transparency mode is very fine, enabling a very high single-frequency output.

Furthermore, the reduction of the ohmic losses due to operation in induced transparency mode makes it possible to increase by one order of magnitude the confinement factor Γ of the guided mode with the periodic Bragg grating disturbance.

A greater Bragg grating strength makes it possible to reduce the length of the device and move towards greater miniaturisation of laser sources that may find a role in optical fibre communication applications.

The resonant properties of the meta-material are strongly dependent on the optical mode polarisation. The inventors were able to detect a high tolerance, of 15 dB, for the optical feedback in the induced transparency mode. A tolerance of 19 dB is considered to be satisfactory for a number of applications, in particular according to the standard IEEE 802.3.

The invention also relates to a telecommunication device comprising a laser diode according to the invention as an optical source.

Advantageously, the use of a laser diode according to the invention makes it possible to do away with the need for an optical isolator.

A laser diode according to the invention may also be inserted into a photonic integrated circuit (PIC) or in sensors or optical instruments.

The invention was described above using embodiments presented in the figures, without restricting the general inventive concept.

Many other modifications and variations suggest themselves to those skilled in the art, after considering the different embodiments illustrated in this application. These applications are given by way of example and are not intended to restrict the scope of the invention, which is determined exclusively by the claims hereinafter.

In the claims, the term "comprising" does not exclude other elements or steps, and the use of the indefinite article "a" does not exclude a plurality. The mere fact that the different features are listed in mutually dependent claims does not indicate that a combination of these features cannot be advantageously used. Finally, any reference used in the claims must not be interpreted as a restriction of the scope of the invention.

The invention claimed is:

1. A distributed feedback laser diode comprising a waveguide with a gain medium assisted by a grating formed by a distribution of elements including a subset comprising localised resonators distributed along an axis of the waveguide, wherein:

a characteristic frequency of feedback induced on a wave of the guide by the spatial distribution of the elements differs by less than 50% from a resonance frequency of the localised resonators; and the laser diode is configured such that an optical confinement factor of the wave of the guide with localised resonators is adjusted so as to enable an induced transparency phenomenon.

2. The laser diode of claim 1, wherein the elements are distributed in the form of a periodic grating along a main axis of the waveguide.

3. The laser diode of claim 1, wherein the characteristic frequency of the feedback induced by the grating formed by the distributed elements differs by less than 20% from the resonance frequency of the localised resonators themselves.

4. The laser diode of claim 1, wherein the localised resonators comprise at least one element having a dimension between $1/5$ and $1/20$ of the ratio between speed of light (c) and a frequency (f) of laser emission in a direction substantially perpendicular to a main axis of the waveguide.

5. The laser diode of claim 4, wherein the elements forming the resonant localised resonators are arranged such that a greatest dimension is oriented along a direction of one of a non-null electric field of the guided wave.

6. The laser diode of claim 5, wherein the resonant elements of the localised resonators are arranged such that the greatest dimension is oriented along a direction of a dominant electric field of the guided wave.

7. The laser diode of claim 6, wherein the localised resonators are arranged along a direction substantially perpendicular to the main axis of the waveguide with a separation therebetween less than the dimension of the localised resonators along the direction.

8. The laser diode of claim 7, wherein the separation is between $1/10$ and $1/50$ of c/f.

9. The laser diode of claim 6, wherein a distance between localised resonators closest to the waveguide and the flank of the waveguide is less than or equal to $1/10$ of c/f.

10. The laser diode of claim 9, wherein the localised resonators closest to the waveguide are in contact with one of the edges of the guide.

11. The laser diode of claim 6, wherein localised resonators are at least partially inside the waveguide.

12. The laser diode of claim 6, wherein a period of the periodic grating comprises between 1 and 10 localised resonators.

13. The laser diode of claim 1, wherein the localised resonators consist of a meta-material of dielectric, metallic or metallo-dielectric nature.

14. The laser diode of claim 1, wherein a quality factor of the localised resonators is adjusted between 10 and 100 using a dissipative material at a laser emission frequency.

15. The laser diode of claim 14, wherein the dissipative material is a metal.

16. A telecommunication device comprising a laser diode of claim 1 as an optical source.

17. The telecommunication device of claim 16, further defined as not comprising an optical isolator.

* * * * *